(12) United States Patent
Lips et al.

(10) Patent No.: US 10,705,167 B2
(45) Date of Patent: Jul. 7, 2020

(54) RF TRANSMIT SYSTEM WITH SELECTABLE DRIVE PORTS FOR MAGNETIC RESONANCE IMAGING APPARATUSES

(71) Applicant: KONINKLIJKE PHILIPS N.V., Eindhoven (NL)

(72) Inventors: Oliver Lips, Hamburg (DE); Peter Vernickel, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 92 days.

(21) Appl. No.: 16/090,282

(22) PCT Filed: Apr. 4, 2017

(86) PCT No.: PCT/EP2017/057937
§ 371 (c)(1),
(2) Date: Oct. 1, 2018

(87) PCT Pub. No.: WO2017/174552
PCT Pub. Date: Oct. 12, 2017

(65) Prior Publication Data
US 2019/0113586 A1 Apr. 18, 2019

(30) Foreign Application Priority Data
Apr. 4, 2016 (EP) .................................... 16163738

(51) Int. Cl.
*G01R 33/36* (2006.01)
*G01R 33/34* (2006.01)
*G01R 33/345* (2006.01)

(52) U.S. Cl.
CPC ..... *G01R 33/3664* (2013.01); *G01R 33/3453* (2013.01); *G01R 33/34076* (2013.01); *G01R 33/3678* (2013.01)

(58) Field of Classification Search
CPC ...... G01R 33/28; G01R 33/288; G01R 33/32; G01R 33/34; G01R 33/34015;
(Continued)

(56) References Cited

U.S. PATENT DOCUMENTS 8,030,920 B2 * 10/2011 Vu ..................... G01R 33/288
324/307
2008/0272787 A1 * 11/2008 Boskamp ........... G01R 33/3415
324/322

(Continued)

FOREIGN PATENT DOCUMENTS

WO    2012093321 A1    7/2012
WO    2012143833 A1   10/2012

OTHER PUBLICATIONS

Cecil E. Hayes et al, "An Efficient, Highly Homogeneous Radiofrequency Coil for Whole-Body NMR Imaging at 1.5 T", Journal of Magnetic Resonance 63: 622-628 (1985).

(Continued)

*Primary Examiner* — Tung X Nguyen

(57) ABSTRACT

A radio frequency transmit system (40) for use in magnetic resonance imaging apparatuses, comprising a radio frequency driver unit (42) including at least a first radio frequency power source (44; 82) and a second radio frequency power source (46; 84), a radio frequency coil arrangement (48) for generating an RF magnetic excitation field $B_1$, and a plurality of switching members (68, 70, 72, 74) electrically connecting the radio frequency power sources (44, 46; 82, 84) to different pairs of drive ports (58, 60, 62, 64) in a first and in at least a second switching status. The first drive port (58) of the first pair of drive ports (58, 60) and the first drive port (62) of the at least second pair of drive ports (62, 64) are arranged spaced by a fixed predetermined angular distance in the azimuthal direction (56)

(Continued)

about the center axis (50); and a magnetic resonance imaging system (10) including such radio frequency transmit system (40).

14 Claims, 5 Drawing Sheets

(58) Field of Classification Search
CPC .......... G01R 33/34023; G01R 33/3403; G01R 33/34038; G01R 33/34046; G01R 33/34053; G01R 33/34061; G01R 33/34069; G01R 33/34076; G01R 33/34084; G01R 33/34092; G01R 33/341; G01R 33/3415; G01R 33/36; G01R 33/3607; G01R 33/3614; G01R 33/3621; G01R 33/3628; G01R 33/3635; G01R 33/3642; G01R 33/365; G01R 33/3657; G01R 33/3664; G01R 33/3671; G01R 33/3678; G01R 33/3685; G01R 33/3692; G01R 33/38; G01R 33/3802; G01R 33/3804; G01R 33/3806; G01R 33/3808; G01R 33/381; G01R 33/3815; G01R 33/383; G01R 33/385; G01R 33/3852; G01R 33/3854; G01R 33/3856; G01R 33/387; G01R 33/3873; G01R 33/3875; G01R 33/48; G01R 33/4802; G01R 33/4804; G01R 33/543; G01R 33/546
See application file for complete search history.

(56) References Cited

U.S. PATENT DOCUMENTS

| 2008/0297155 | A1 | 12/2008 | Kroeckel |
| 2009/0251145 | A1 | 10/2009 | Kaneko et al. |
| 2013/0300415 | A1 | 11/2013 | Harvey et al. |
| 2015/0177342 | A1 | 6/2015 | Lips et al. |

OTHER PUBLICATIONS

J.T. Vaughan, "Detunable Transverse Electromagnetic (TEM) Volume Coil for High-Field NMR", Magnetic Resonance in Medicine 47: 990-1000 (2002).

R. Pohmann, "An experimental comparison of B1-mapping Techniques at two field strengths", Proc. Intl. Soc. Mag. Reson. Med. 19 (2011): 4410.

Rolf Pohmann et al: "A theoretical and experimental comparison of different techniques for B 1 mapping at very high fields",NMR in Biomedicine.,vol. 26, No. 3,Mar. 13, 2013 (Mar. 13, 2013) , pp. 265-275.

* cited by examiner

RF TRANSMIT SYSTEM WITH SELECTABLE DRIVE PORTS FOR MAGNETIC RESONANCE IMAGING APPARATUSES

CROSS REFERENCE TO RELATED APPLICATIONS

This application is a U.S. national phase application of International Application No. PCT/EP2017/057937, filed on Apr. 4, 2017, which claims the benefit of EP Application Serial No. 16163738.4 filed on Apr. 4, 2016, which is incorporated herein by reference.

FIELD OF THE INVENTION

The invention pertains to a radio frequency transmit system for use in a magnetic resonance imaging apparatus for generating a radio frequency magnetic excitation field, a magnetic resonance imaging system employing such radio frequency transmit system and a method of operating such radio frequency transmit system in such magnetic resonance imaging system.

BACKGROUND OF THE INVENTION

In the art of magnetic resonance imaging (MRI) it is desirable to have a radio frequency (RF) magnetic resonance (MR) excitation field $B_1$ of a high degree of homogeneity for exciting nuclei of or within the subject of interest. Multi-channel transmit MRI has been accepted as a standard method of operating volume RF coils to achieve a relatively uniform RF magnetic excitation field $B_1$. Compared with a single-channel mode of operation, a two-channel transmit technique results in a significantly increased $B_1$ homogeneity.

In known multi-channel transmit systems, an RF power signal is typically supplied to an RF coil arrangement via RF drive ports being connected to individual resonator elements of the RF coil arrangement. Two-channel transmit MR systems typically use two independent RF transmit chains and amplifiers for applying the RF power signals to the RF drive ports of the coil arrangement. The RF power applied to the different RF drive ports can be controlled individually in order to optimize the homogeneity of the RF field (so-called 'RF shimming').

A conventional RF transmit system is schematically illustrated in FIG. 2. Herein, the RF transmit system comprises an RF coil arrangement CA that is designed as a birdcage coil having a pair of circular loop members L1, L2 and a plurality of 16 interconnecting rungs R, as is well known in the art. The RF coil arrangement further includes a pair of drive ports DP that are electrically connected to rungs or to the circular loop members and are arranged at locations that are spaced by an angular distance of 90° in an azimuthal direction about a birdcage coil center axis A. RF power from two RF power sources P1, P2 is provided to the pair of drive ports DP to excite two orthogonal modes of the birdcage coil.

By way of example, international application WO 2012/093321 A1 describes a multi-channel (e.g. quadrature) MRI transmit system in which RF power amplifiers having different power capabilities are used in different transmit channels. This results in reduced system costs, due to the avoidance of an unused excess of RF power capability when the power demand for obtaining a homogeneous $B_1$ field (RF shimming) is asymmetric and the asymmetry is qualitatively the same for different imaging applications. The multi-channel transmit unit may also comprise a commutator which enables to selectively connect each RF power amplifier to each drive port of transmit coil arrangement (e.g. a birdcage coil).

SUMMARY OF THE INVENTION

In known multi-channel MRI RF transmit systems as the one described above, often setting conditions for relative phase and relative power of employed RF power amplifiers for achieving a desired RF shimming for optimized homogeneity of an RF magnetic excitation field $B_1$ need to be applied in which one RF power amplifier has to deliver significantly more power than others, even up to its maximum power rating. In such cases, the maximum power rating may be reached quite soon, while the available power of other amplifiers remains unused.

It is therefore an object of the invention to provide an improved MRI RF transmit system that counteracts the imbalance between nominal RF power rating and actually used RF power, by which larger values for an RF magnetic excitation field strength $B_1$ can be achieved and/or a requirement specification for maximum RF power rating can be relaxed.

In one aspect of the present invention, the object is achieved by a radio frequency transmit system for use in magnetic resonance imaging apparatuses. The radio frequency transmit system comprises:

a radio frequency driver unit including at least a first radio frequency power source and a second radio frequency power source, and a radio frequency coil arrangement which has a center axis and further includes a plurality of radio frequency coil members and a plurality of at least two pairs of drive ports electrically connected to radio frequency coil members of the plurality of radio frequency coil members. The radio frequency coil arrangement is configured for generating an RF magnetic excitation field $B_1$ when radio frequency power is being supplied to a pair of drive ports of the plurality of drive ports.

The drive ports of each pair of drive ports of the plurality of pairs of drive ports are arranged spaced by an angular distance of 90° in an azimuthal direction about the center axis.

The radio frequency transmit system further includes a plurality of switching members that are configured for electrically connecting, in a first switching status, the first radio frequency power source to a first drive port of a first pair of drive ports of the plurality of drive ports and for electrically connecting the second radio frequency power source to a second drive port of the first pair of drive ports. The switching members of the plurality of switching members are further configured for electrically connecting, in at least a second switching status, the first radio frequency power source to a first drive port of the at least second pair of drive ports of the plurality of drive ports and for electrically connecting the second radio frequency power source to a second drive port of the at least second pair of drive ports. The first drive port of the first pair of drive ports and the first drive port of the at least second pair of drive ports are arranged spaced by a fixed predetermined angular distance in the azimuthal direction about the center axis.

The term "radio frequency power sources", as used in this application, shall encompass power sources that are configured to independently generate radio frequency power, as well as power sources that are supplied with radio frequency power generated by a common radio frequency power source. In particular, radio frequency power sources may include radio frequency amplifying means and/or radio frequency power splitters and/or combiners.

The phrase "electrically connecting/electrically connected", as used in this application, shall be understood to encompass galvanic electrical connections as well as electrical connections established by capacitive and/or inductive electromagnetic coupling.

The term "plurality" in context with any object, as used in this application, shall in particular be understood as a quantity of at least two of the objects.

The phrase "being configured to", as used in this application, shall in particular be understood as being specifically programmed, laid out, furnished or arranged.

It is further noted herewith that the terms "first", "second", etc. are used for distinction purposes only and are not meant to indicate a sequence or a priority in any way.

One advantage of the proposed RF transmit system lies in that power levels of employed RF power sources for achieving a desired RF shimming can be brought closer together such that a strong imbalance between a nominal RF power rating of an RF power source and an RF power level that is actually provided by the RF power source can beneficially be avoided.

Another advantage lies in that, depending on a scanned anatomy and a shape and position of a subject of interest, an RF magnetic excitation field $B_1$ with a suitable RF shimming can be provided with low adjustment effort.

Preferably, the RF coil members of the plurality of RF coil members are resonant at a Larmor frequency.

In a preferred embodiment of the RF transmit system the first radio frequency power source and the second radio frequency power source have an equal nominal power rating. In this case, the strong imbalance between a nominal RF power rating of an RF power source and an RF power level that is actually provided by the RF power source can be dissolved at least to a large extent or even completely.

Preferably, the RF coil arrangement is configured as a birdcage coil or a TEM coil. The birdcage coil design is well known in the art, for instance from the article by Cecil E. Hayes et al, "*An Efficient, Highly Homogeneous Radiofrequency Coil for Whole-Body NMR Imaging at 1.5 T*", Journal of Magnetic Resonance 63: 622-628 (1985). TEM coils are for example described in J. T. Vaughan, "*Detunable Transverse Electromagnetic (TEM) Volume Coil for High-Field NMR*", Magnetic Resonance in Medicine 47: 990-1000 (2002). Both these documents shall hereby be incorporated by reference in its entirety with effect for those jurisdictions that permit incorporation by reference.

The birdcage coil design may be of a low pass, band pass or high pass design. The RF coil arrangement configured as a birdcage coil or a TEM coil may be designed as a body coil for excitation of nuclei in a most part of the subject of interest, or it may be designed as a local coil for excitation of nuclei in a portion of the subject of interest, such as for instance for MR imaging of the head of the subject of interest.

In preferred embodiments of the RF transmit system, in at least one plane arranged perpendicular to the center axis, centers of the plurality of radio frequency coil members are arranged on a circumference of a virtual ellipse. It is noted that the term "ellipse" shall encompass a circle as a special case. For briefness, an RF coil arrangement of this kind may be referred to as an elliptical RF coil arrangement in the following.

In this way, the invention is applicable for replacing or retrofitting existing RF transmit systems with widely spread RF coil arrangements having elliptical cross-section.

As is described in detail in the above-mentioned references, typically two usable orthogonal modes with sinusoidal current distribution exist for elliptical (including cylindrical) birdcage coil or TEM-type RF coil arrangements. However, an orientation of these modes is basically only defined by positions of drive ports along a coil circumference. In principle, when positioned within the RF coil arrangement, the patient breaks the symmetry and, by that, the orientation of the two orthogonal modes on the circumference is defined. However, the two orthogonal modes can be tuned and/or matched in such a way, that two orthogonal modes can be excited anywhere along the circumference by two drive ports being spaced by an angular distance of 90° in an azimuthal direction about the center axis.

Preferably, the fixed predetermined angular distance has an absolute value between 10° and 45°. By this, a wide range of RF shimming can be provided, while at the same time an imbalance between a nominal RF power rating of an RF power source and an RF power level that is actually provided by the RF power source can be kept low.

In some embodiments of the RF transmit system, the first radio frequency power source and the second radio frequency power source are configured as two output ports of a 90° hybrid coupler that is electrically connected at an input port to a single RF power source. In this way, a part-saving and cost-effective solution with certain limitations regarding RF power setting parameters can be provided that suffices for a large number of MRI applications.

In preferred embodiments of the RF transmit system, electrical connections for connecting the drive ports to the switching members comprise at least one RF transmission line with an effective electrical length that is equal to a whole multiple of one half of a wavelength of the Larmor frequency. In this way, an open end of the RF transmission line is transformed to an open end at the drive port, by which a radio frequency insulation between the RF transmission line and the drive port of the RF coil arrangement is improved and an efficiency and performance of the RF coil arrangement is virtually unaffected.

Preferably, the switching members of the plurality of switching members comprise at least one out of a mechanical switch, a diode, a transistor and an MEMS (microelectromechanical system) radio frequency switch. In this way, a selection of a pair of drive ports of the plurality of pairs of drive ports can readily be carried out. As requirements in regard of a switching time of the switching members are quite relaxed, mechanical switches with low losses are most preferable.

In another aspect of the invention, an MRI system configured for acquiring MR signals from at least a portion of a subject of interest and for providing MR images from the acquired MR signals is provided. The MR imaging system comprises:

an examination space provided to arrange at least a portion of the subject of interest within, and a main magnet that is configured for generating a quasi-static magnetic field $B_0$ at least in the examination space, wherein the examination space is arranged within the magnetic field $B_0$ of the main magnet.

Moreover, the MRI system includes:

a control unit that is configured for controlling functions of the MRI system, a signal processing unit provided for processing MR signals to generate at least one image of at least the portion of the subject of interest from the received MR signals, and an embodiment of the RF transmit system disclosed herein.

The benefits presented for the RF transmit system are applicable to the MR imaging system to the full extent.

In yet another aspect of the invention, the object is achieved by a method of operating an embodiment of the RF transmit system disclosed herein in the MR imaging system disclosed above.

The method includes steps of:

based on predetermined calibration results, selecting a pair of drive ports of the plurality of pairs of drive ports, electrically connecting a first drive port of the selected pair of drive ports to the first RF power source and a second drive port of the selected pair of drive ports to the second RF power source via the plurality of switching members, and providing RF power from the first radio frequency power source and the second radio frequency power source to the selected pair of drive ports.

The predetermined calibration results may be specific to one or more of various categories including, but not being limited to, anatomy to be imaged, size and/or shape of the subject of interest, position and orientation of the subject of interest relative to the examination space. In this way, an RF magnetic excitation field $B_1$ can readily be generated with an appropriate RF shimming and a low imbalance between a nominal RF power rating of the RF power sources and an RF power level that is actually provided by the RF power sources.

In a preferred embodiment, the method further includes steps of:

conducting a first magnetic resonance scan, using the selected pair of drive ports, generating a first magnetic resonance image from the conducted first magnetic resonance scan, selecting a different pair of drive ports of the plurality of drive ports for providing RF power to, conducting a second magnetic resonance scan, using the selected different pair of drive ports, and generating a magnetic resonance image from the conducted second magnetic resonance scan.

In this way, the RF shimming of the RF magnetic excitation field $B_1$ can be fine-tuned. Preferably, the pair of drive ports yielding an MR image with superior properties with regard to at least one MR image criterion is selected for generating the RF magnetic excitation field $B_1$ during an MR imaging session to be subsequently executed.

In preferred embodiments, the method comprises preceding steps of:

selecting a pair of drive ports of the plurality of pairs of drive ports, electrically connecting a first drive port of the selected pair of drive ports to the first radio frequency power source and a second drive port of the selected pair of drive ports to the second radio frequency power source via the plurality of switching members, providing radio frequency power from the first radio frequency power source and the second radio frequency power source to the selected pair of drive ports, conducting a mapping measurement of the radio frequency magnetic excitation field $B_1$ generated by the radio frequency coil arrangement, based on a result of the mapping measurement, determine a specific pair of drive ports of the plurality of pairs of drive ports that is able to generate the radio frequency magnetic excitation field $B_1$ with a highest value regarding a radio frequency magnetic excitation field $B_1$-related optimization parameter under the constraint of an as equal as possible radio frequency power demand of a first drive port of the specific pair of drive ports and a second drive port of the specific pair of drive ports.

In this way, results of a single mapping measurement can be used as a basis for selecting a pair of drive ports of the plurality of pairs of drive ports that is appropriate for the desired MR examination.

If, for illustration purposes, the left-hand side of FIG. 4 shows the results of the mapping measurement of the radio frequency magnetic excitation field $B_1$ generated with the selected pair of drive ports, the specific pair of drive ports of the plurality of pairs of drive ports that is able to generate the radio frequency magnetic excitation field $B_1$ under the constraint of an as equal as possible radio frequency power demand can be determined by positioning a square in the vector diagram of FIG. 4 such that one corner of the square coincides with the starting point of the vector that represents the radio frequency magnetic excitation field $B_1$ which, in turn, coincides with the diagonal of the square. Obviously, an optimum azimuthal position for a first drive port of the specific pair of drive ports can be determined by rotating an azimuthal angle of the generated radio frequency magnetic excitation field $B_1$ by 45° about the center axis of the radio frequency coil arrangement. The drive port that is located closest to the optimum azimuthal position can then be selected as the first drive port of the specific pair of drive ports.

In yet another embodiment, the method comprises preceding steps of:

selecting a pair of drive ports of the plurality of pairs of drive ports, electrically connecting a first drive port of the selected pair of drive ports to the first radio frequency power source and a second drive port of the selected pair of drive ports to the second radio frequency power source via the plurality of switching members, providing RF power from the first RF power source and the second RF power source to the selected pair of drive ports, conducting a mapping measurement of the RF magnetic excitation field $B_1$ generated by the RF coil arrangement, repeating the preceding steps for all pairs of drive ports of the plurality of pairs of drive ports, recording the specific pair of drive ports of the plurality of pairs of drive ports that provides the RF magnetic excitation field $B_1$ with a highest value regarding a radio frequency magnetic excitation field $B_1$-related optimization parameter under the constraint of an as equal as possible RF power demand of a first drive port of the specific pair of drive ports and a second drive port of the specific pair of drive ports.

In this way, predetermined calibration results can be provided as a basis for selecting a pair of drive ports of the plurality of pairs of drive ports that is appropriate for the desired MR examination.

The mapping measurement may refer to the full tissue-covered part of an imaging slice or to a sub-part of an imaging slice, such as a specific anatomy, which may for instance be formed by a liver.

Methods for mapping the RF magnetic excitation field $B_1$ are, by way of example, described in the article by R. Pohmann, "*An experimental comparison of B1-mapping Techniques at two field strengths*", Proc. Intl. Soc. Mag. Reson. Med. 19 (2011): 4410, which shall hereby be incorporated by reference in its entirety with effect for those jurisdictions that permit incorporation by reference.

Preferably, the optimization parameter is selected from a group formed by:

a degree of homogeneity of the radio frequency magnetic excitation field $B_1$, radio frequency power efficiency, defined as the ratio of a total radio frequency power applied to the achievable average radio frequency magnetic excitation field $B_1$ in a selected slice, and the reciprocal of a local or global specific absorption rate (SAR) generated by the radio frequency magnetic excitation field $B_1$.

Preferably, the local or global SAR is determined using previous knowledge obtained from mathematical simulation.

In this way, flexible optimization under the constraint of an as equal as possible radio frequency power demand of the drive ports can be enabled.

The step of electrically connecting a first drive port of the selected pair of drive ports to the first radio frequency power source and connecting a second drive port of the selected pair of drive ports to the second radio frequency power source via the plurality of switching members shall be understood such that all other pairs of drive ports are electrically insulated.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
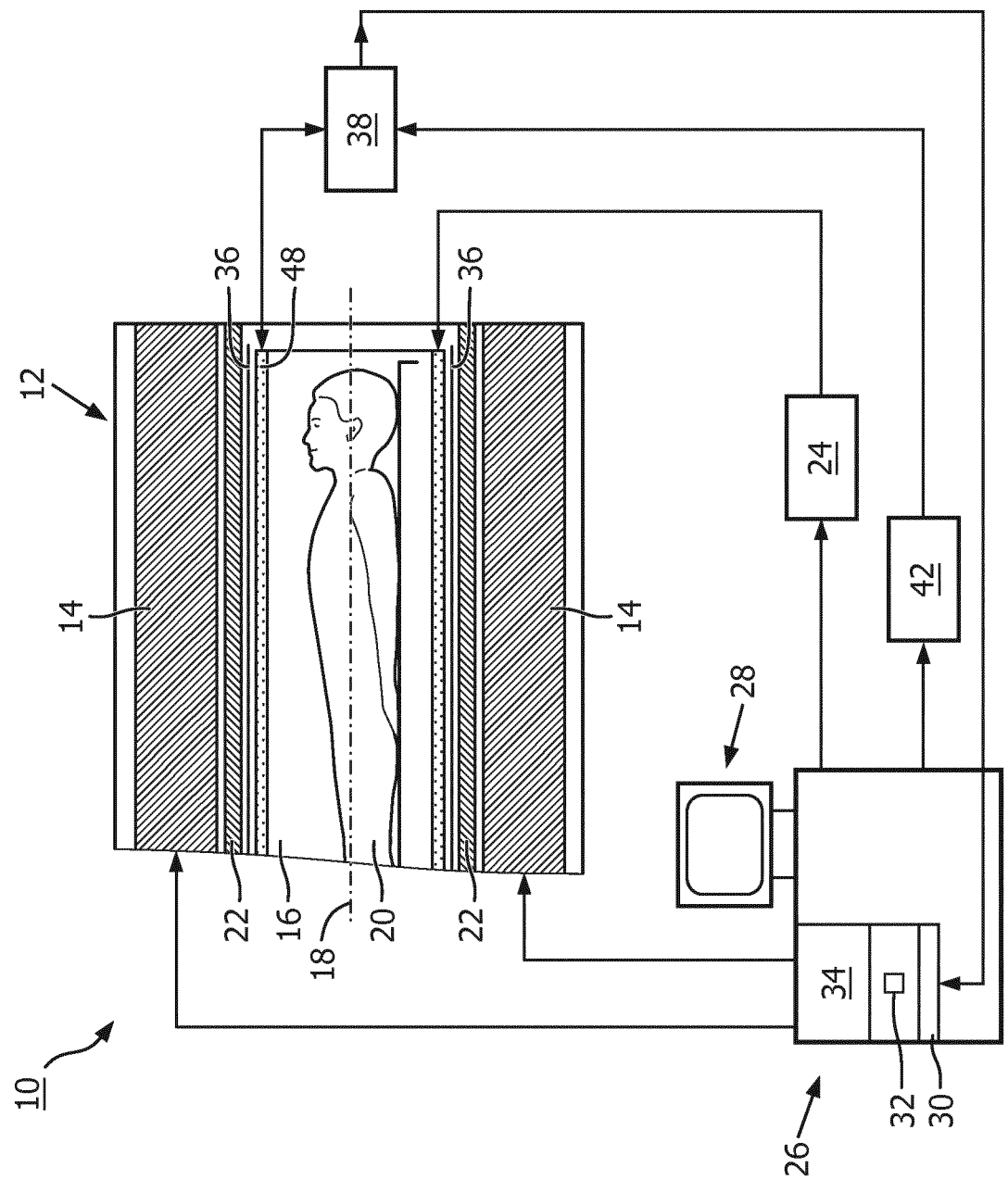
FIG. 1 shows a schematic illustration of a part of a magnetic resonance examination system including an embodiment of a radio frequency transmit system in accordance with the invention, FIG. 2 schematically illustrates a conventional two-channel radio frequency transmit system, FIG. 3 schematically illustrates a detailed view of the radio frequency transmit system pursuant to FIG. 1.
Figure 2:
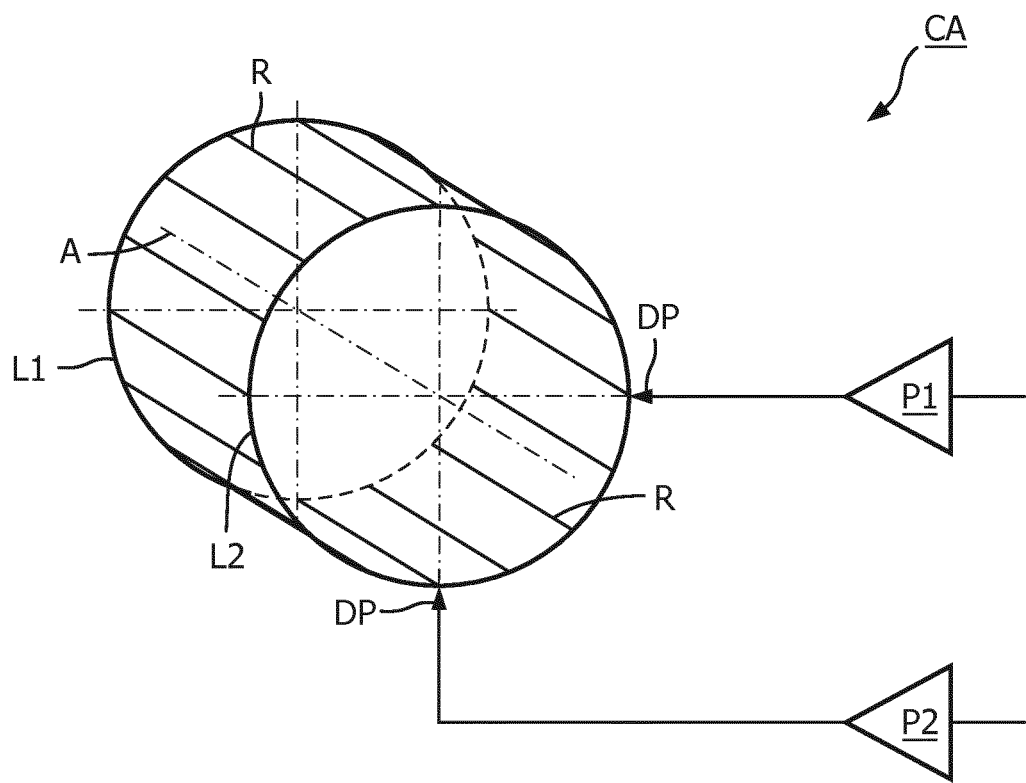

FIG. 1 shows a schematic illustration of a part of an embodiment of a magnetic resonance imaging (MRI) system 10 that is configured for acquiring magnetic resonance (MR) signals from at least a portion of a subject of interest 20, usually a patient, and for providing MR images from the acquired MR signals. The MRI system 10 comprises a scanner unit 12 having a main magnet 14. The main magnet 14 has a central bore that provides an examination space 16 around a center axis 18 for at least the portion of the subject of interest 20 to be arranged within at least during examination, and is further configured for generating a quasi-static magnetic field $B_0$ of appropriate magnetic field strength, for example 3.0 T, at least in the examination space 16. For clarity reasons, a customary table for supporting the subject of interest 20 is omitted in FIG. 1. The static magnetic field $B_0$ defines an axial direction that is usually denoted as the direction of the z-axis of a Cartesian coordinate system and is aligned in parallel to the center axis 18 of the examination space 16.

Although this specific embodiment of an MRI system is described as one of the bore-type, it will readily be appreciated by those skilled in the art that the invention is also applicable to other types of MRI systems, such as open (C-arm) MRI systems.

The MRI system 10 comprises a control unit 26 configured to control functions of the scanner unit 12 and other functions of the MRI system 10. The control unit 26 includes a digital data memory unit 30, a processor unit 32 having data access to the digital data memory unit 30 and a human interface device 28 provided for transferring information between the control unit 26 and an operator, usually a medical staff member.

Further, the MRI system 10 comprises a signal processing unit 34 provided for processing MR signals to generate MR images of at least the portion of the subject of interest 20 from the received MR signals.

Moreover, the MRI system 10 includes a radio frequency (RF) transmit system 40 comprising an RF driver unit 42 and an RF coil arrangement 48. The RF transmit system 40 is configured, controlled by the control unit 26, for applying an RF magnetic excitation field $B_1$ to nuclei of or within the subject of interest 20 for magnetic resonance excitation during RF transmit time periods to excite the nuclei of or within the subject of interest 20 for the purpose of magnetic resonance imaging.

Figure 3:
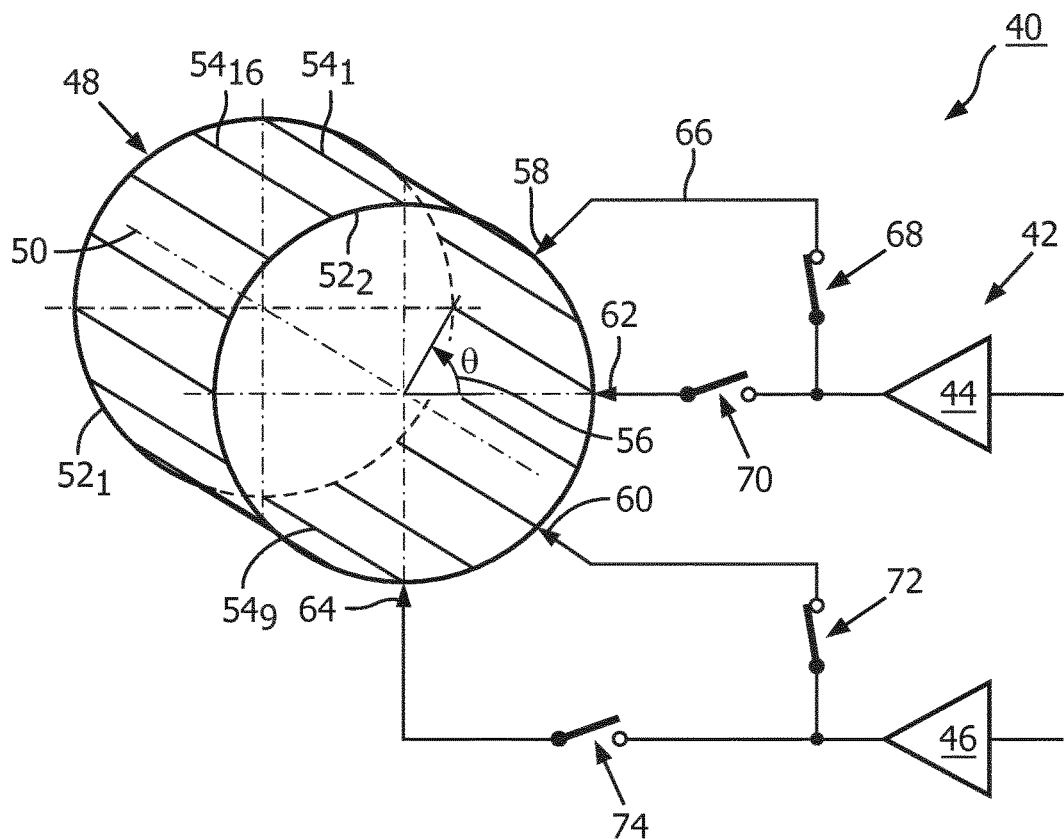
Figure 3:
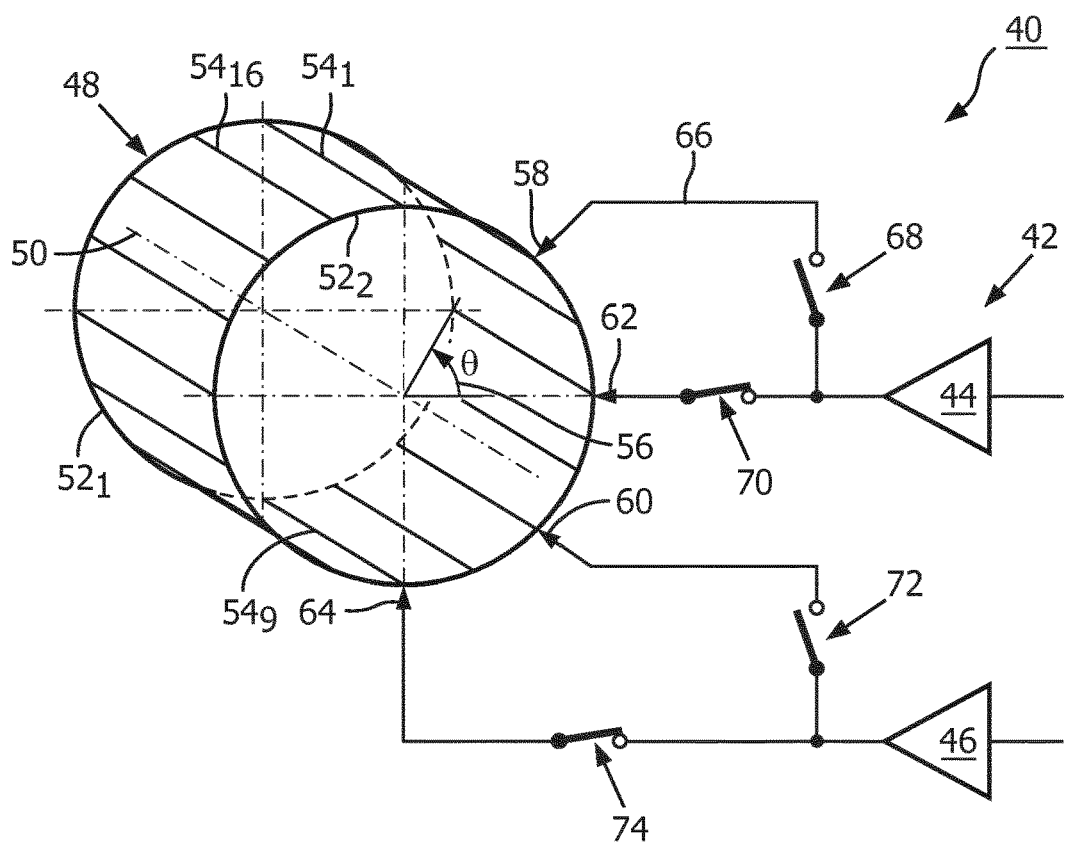

A detailed view of the RF transmit system 40 is schematically shown in FIG. 3. The RF coil arrangement 48 is configured as a whole-body coil. The whole-body coil comprises a plurality of RF coil members 52, 54 that are arranged and are electrically connected in the well-known birdcage coil design, and are resonant at a Larmor frequency that is defined by the gyromagnetic ratio of the nuclei under examination and a field strength $B_0$ of the quasi-static magnetic field. The RF coil arrangement 48 has a center axis 50 and, in the operational state, is arranged concentrically within the bore of the main magnet 14 such that the center axis 50 of the RF coil arrangement 48 and the center axis 18 of the examination space 16 coincide. As is common in the art, a metal RF shield 36 (FIG. 1) is arranged concentrically around the RF coil arrangement 48.

Referring again to FIG. 3, the plurality of RF coil members comprises a pair of identical conductive loop members $52_1$, $52_2$ of elliptical, more specifically circular shape spaced along a common longitudinal axis given by the center axis 50, and a plurality of 16 rungs $54_1$-$54_{16}$ designed as straight conductors that electrically interconnect the conductive loop members $52_1$, $52_2$ and are aligned in parallel to an axial direction. In a plane perpendicular to the center axis 50, the rungs $54_1$-$54_{16}$ are arranged on a circumference of a virtual ellipse formed as a circle having the same diameter as the loop members $52_1$, $52_2$. The RF coil arrangement 48 may be designed as a band pass type, a low pass type or a high pass type birdcage coil. For clarity reasons, capacitors are therefore not shown in FIG. 3. The rungs $54_1$-$54_{16}$ are equidistantly arranged with respect to an azimuthal direction 56 about the center axis 50, i.e. an angular distance in the azimuthal direction 56 about the center axis 50 between two adjacently arranged rungs $54_1$-$54_{16}$ is 22.5°.

The RF coil arrangement 48 is excitable at various separate resonance frequencies. Methods of selecting birdcage coil design parameters for accomplishing this are known in the art and therefore need not be discussed in detail herein. The two resonant modes of the RF coil arrangement 48 considered for excitation are the ones whose RF current distribution in the rungs $54_1$-$54_{16}$ is proportional to sin θ (mode 1) or cos θ (mode 2), respectively, wherein θ denotes the azimuthal angle measured in the azimuthal direction 56 about the center axis 50 of the RF coil arrangement 48.

The RF coil arrangement 48 further includes a plurality of two pairs of drive ports 58, 60, 62, 64 electrically connected to RF coil members 52 of the plurality of RF coil members 52, 54, namely to four rungs out of the plurality of rungs $54_1$-$54_{16}$. The drive ports 58, 60, 62, 64 of each pair of the plurality of pairs of drive ports 58, 60, 62, 64 are arranged spaced by an angular distance of 90° in the azimuthal direction 56 about the center axis 50. Each pair of drive ports of the plurality of two pairs of drive ports 58, 60, 62, 64 is configured to receive RF power and to transfer the received RF power to the RF coil arrangement 48. The RF coil arrangement 48 is configured for generating an RF magnetic excitation field $B_1$ when RF power is being supplied to a pair of drive ports 58, 60, 62, 64 of the plurality of two pairs of drive ports 58, 60, 62, 64, usually in the form of pulses or sequences of pulses of RF power of an MR radio (Larmor) frequency. The drive ports 58, 60, 62, 64 of the plurality of two pairs of drive ports 58, 60, 62, 64 are located in close proximity to the RF coil members 52, 54.

The RF driver unit 42 includes a first RF power source 44 and a second RF power source 46, each of which is represented by an amplifier symbol in FIG. 3. The first RF power source 44 and the second RF power source 46 have an equal nominal power rating so that rated RF power levels available at an output port of each of the RF amplifiers are equal.

The RF driver unit 42 is configured to feed pulses of RF power of a specified frequency range including the Larmor frequency to the RF coil arrangement 48 via an electronic switch circuit 38 (FIG. 1) during RF transmit phases, as is known in the art.

Furthermore, the RF transmit system 40 includes a plurality of four switching members 68, 70, 72, 74 that comprise mechanical switches, and that are configured for electrically connecting, in a first switching status that is illustrated in the upper part of FIG. 3,
the first RF power source 44 to a first drive port 58 of a first pair of drive ports 58, 60 of the plurality of two pairs of drive ports 58, 60, 62, 64, and
the second RF power source 46 to a second drive port 60 of the first pair of drive ports 58, 60 of the plurality of two pairs of drive ports 58, 60, 62, 64.

The plurality of four switching members 68, 70, 72, 74 is further configured for electrically connecting, in a second switching status that is illustrated in the lower part of FIG. 3,
the first radio frequency power source 44 to a first drive port 62 of the other, second pair of drive ports 62, 64 of the plurality of two pairs of drive ports 58, 60, 62, 64, and
the second radio frequency power source 46 to a second drive port 64 of the other, second pair of drive ports 62, 64 of the plurality of two pairs of drive ports 58, 60, 62, 64.

The electrical connections for connecting the drive ports 58, 60, 62, 64 to the switching members 68, 70, 72, 74 are established by RF transmission lines 66 with an effective electrical length of about 3.3 m, which is equal to a whole multiple of one half of a wavelength of the Larmor frequency, namely two half wavelengths of the Larmor frequency of $^1$H at $B_0$=3.0 T.

In alternative embodiments, an effective wavelength of a whole multiple of one half of a wavelength of the Larmor frequency may be established by a transmission line of a certain effective electrical length that is electrically connected in series to a network comprising lumped capacitors and inductances, as is well known in the art.

As shown in FIG. 3, the first drive port 58 of the first pair of drive ports 58, 60 and the first drive port 62 of the second pair of drive ports 62, 64 are arranged spaced by a fixed predetermined angular distance in the azimuthal direction 56 about the center axis 50, wherein the fixed predetermined angular distance has a value between 10° and 45°, and in this specific embodiment a value of 45°.

The RF coil arrangement 48 is also configured for receiving MR signals during RF receive phases from the nuclei of or within the portion of the subject of interest 20 that have been excited by applying the RF magnetic excitation field $B_1$. During RF receive phases, the electronic switch circuit 38, controlled by the control unit 26, directs the magnetic resonance signals from the RF coil arrangement 48 to the signal processing unit 34 residing in the control unit 26, as is known in the art. In an operational state of the MRI system 10, RF transmit phases and RF receive phases are taking place in a consecutive manner.

Further, the MRI system 10 comprises a gradient coil system 22 (FIG. 1) configured for generating gradient magnetic fields superimposed to the static magnetic field $B_0$. Electric currents are provided to the gradient coil system 22 by the gradient coil driver unit 24, controlled by the control unit 26, in the form of gradient pulse sequences that are synchronized with the RF transmit phases and RF receive phases.

Figure 4:
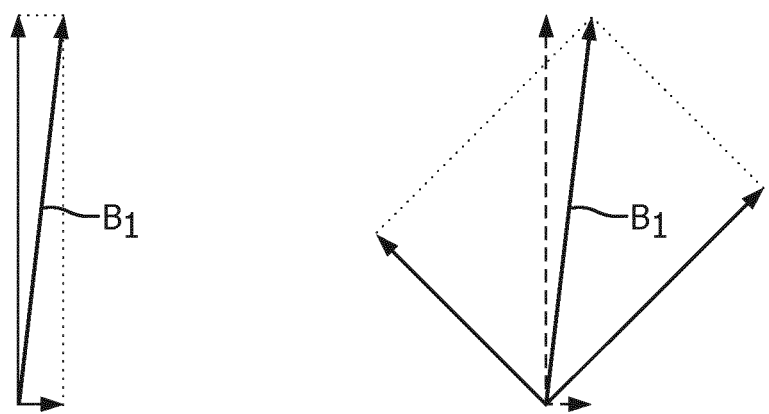
FIG. 4 depicts a superposition of RF magnetic excitation fields generated by providing RF power to different pairs of drive ports of the radio frequency transmit system pursuant to FIG. 3.

FIG. 4 exemplarily illustrates the difference between providing RF power to the first pair of drive ports 58, 60 and providing RF power to the second pair of drive ports 62, 64 for generating a desired RF shimming for the RF magnetic excitation field $B_1$. The desired RF shimming is achieved by superposition of RF magnetic excitation fields generated by providing RF power to the drive ports 58, 60, 62, 64 of a pair of drive ports 58, 60, 62, 64 of the RF coil arrangement 48 pursuant to FIG. 3, wherein a difference in phase of the generated RF magnetic excitation fields is 90° due to the locations of the drive ports 58, 60, 62, 64 of the pairs of drive ports 58, 60, 62, 64.

As shown in the left-hand side of FIG. 4, when RF power is provided to the drive ports 58, 60 of the first pair of drive ports 58, 60, the desired RF shimming for the RF magnetic excitation field $B_1$ requires a high level of RF power from the first RF power source 44 and a relatively low level of RF power from the second RF power source 46. As shown in the right-hand side of FIG. 4, in case of providing RF power to the drive ports 62, 64 of the second pair of drive ports 62, 64 that are shifted by 45° relative to the drive ports 58, 60 of the first pair of drive ports 58, 60, the desired RF shimming for the RF magnetic excitation field $B_1$ is achievable by quite similar levels of RF power demanded from the first RF power source 44 and the second RF power source 46. It is recognizable from the length of the illustrated vectors that a larger amplitude of the desired RF shimming for the RF magnetic excitation field $B_1$ could be achieved if the second RF power source 46 was operated at its nominal RF power rating, and the first RF power source 44 was operated at an RF power level in compliance with the desired RF shimming.

Figure 5:
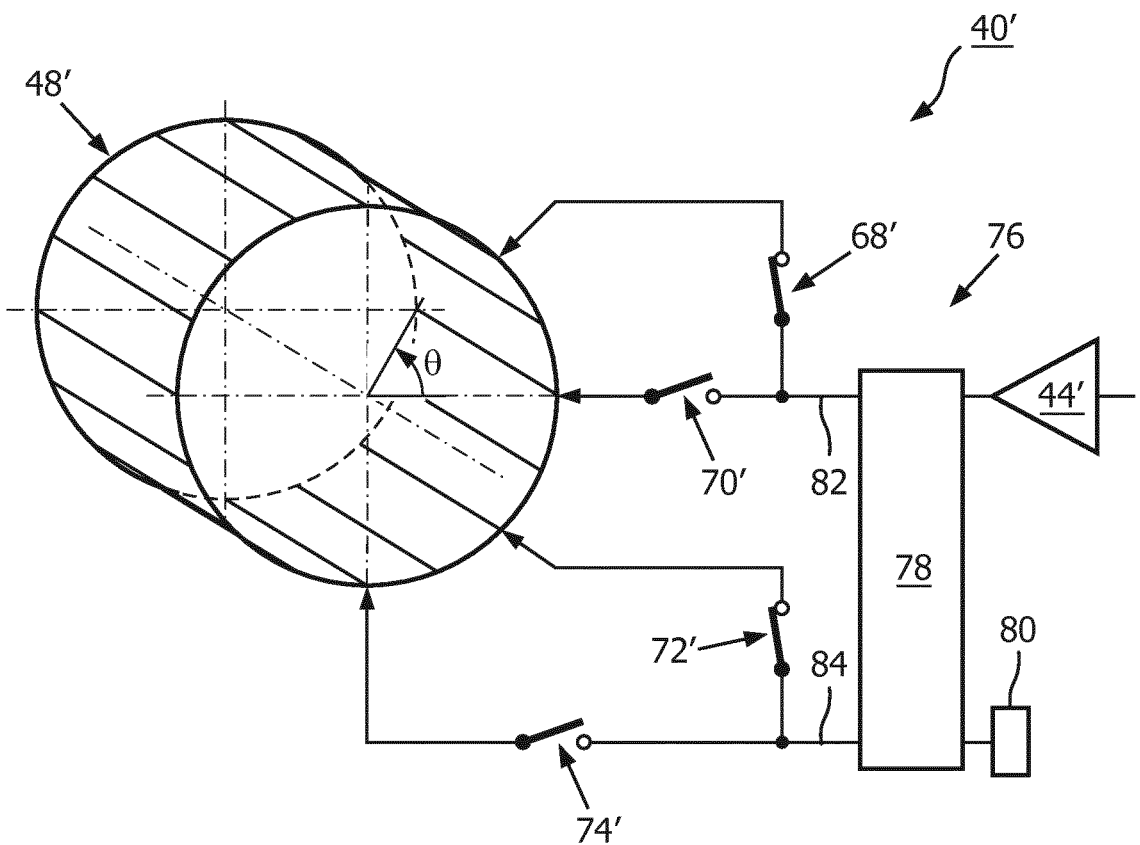
FIG. 5 shows a schematic view of an alternative embodiment of a radio frequency transmit system in accordance with the invention.

FIG. 5 shows a schematic view of an alternative embodiment of an RF transmit system 40' in accordance with the invention. Only features differing from the embodiment pursuant to FIG. 3 will be described. For distinction purposes, primed reference numerals are used in FIG. 5. For features of the alternative embodiments that are not described hereinafter, reference is made to the description of the first embodiment.

The RF transmit system 10' pursuant to FIG. 5 comprises the same RF coil arrangement 48' with the same plurality of switching members 68', 70', 72',74' as the embodiment pursuant to FIG. 3. The main differences between the first embodiment and the alternative embodiment lie in the RF driver unit 76.

The RF driver unit 76 of the RF transmit system 40' pursuant to FIG. 5 includes a 3 dB 90° hybrid RF coupler 78. RF power is fed into an input port shown to be arranged on an upper part of the right side of the hybrid RF coupler 78. The RF power is provided by a single RF power generator represented by an amplifier symbol in FIG. 5. Another input port shown to be arranged on a lower part of the right side of the hybrid RF coupler 78 is equipped with a terminating impedance 80 for avoiding RF power reflection. A first RF power source 82 of the RF driver unit 76 of the RF transmit system 40' pursuant to FIG. 5 is formed by a first (shown as left upper port in FIG. 5) output port of the 90° hybrid RF coupler 78, and a second RF power source 84 is formed by a second (shown as lower port in FIG. 5) output port of the 90° hybrid RF coupler 78. RF power signals available at the first output port and the second output port of the 90° hybrid RF coupler show a relative phase shift of 90°.

Figure 6:
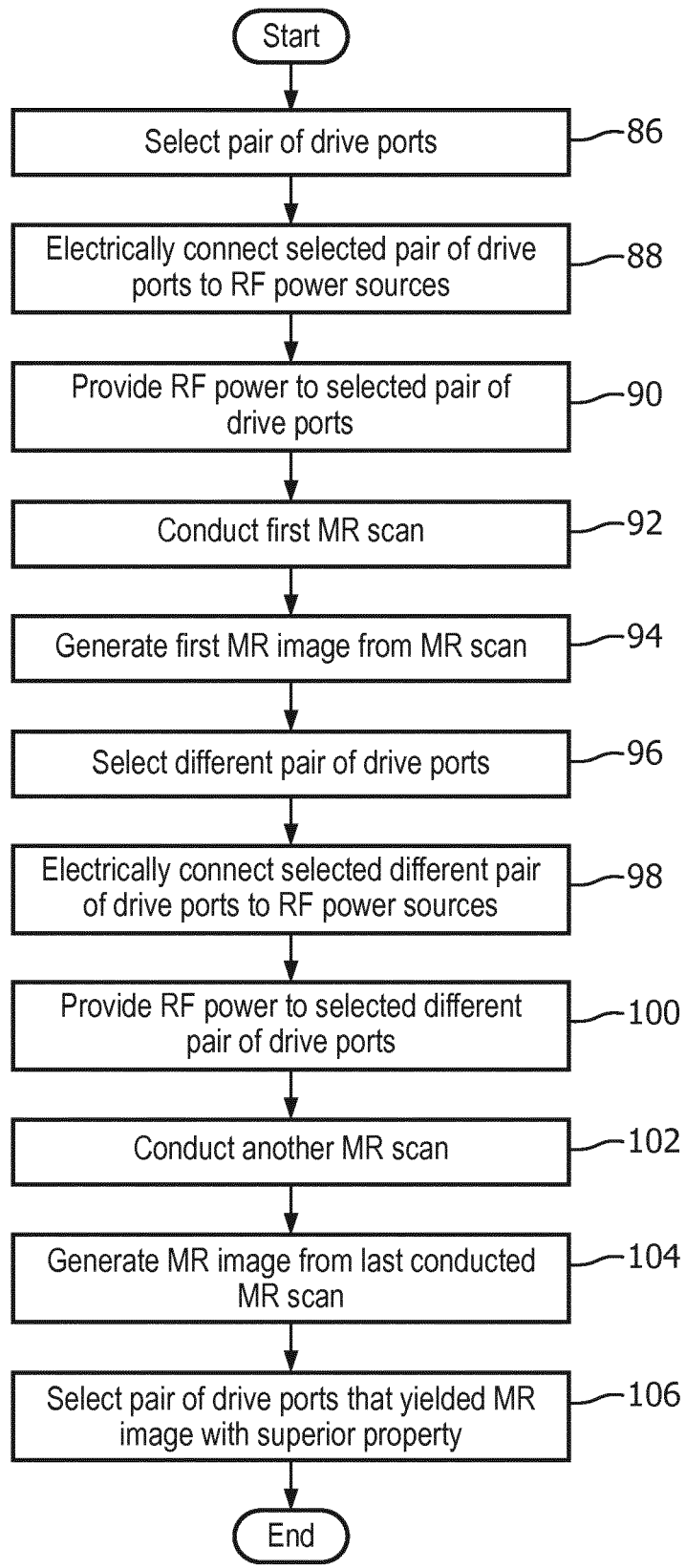
FIG. 6 illustrates a flow chart of an embodiment of the method in accordance with the invention.

In the following, an embodiment of a method of operating the RF transmit system in accordance with the invention is described. A flow chart of the method is given in FIG. 6. It shall be understood that all involved units and devices are in an operational state and configured as illustrated in FIG. 1.

In order to be able to carry out parts of the method, the control unit 26 comprises a software module. The method steps to be conducted are converted into a program code of the software module, wherein the program code is implemented in the digital data memory unit 30 of the control unit 26 and is executable by the processor unit 32 of the control unit 26.

In a first step 86 of the method, a pair of drive ports 58, 60 of the plurality of pairs of drive ports 58, 60, 62, 64 is selected, based on predetermined calibration results. The calibration results consider the categories anatomy to be imaged, size and shape of the subject of interest 20, and position and orientation of the subject of interest 20 relative to the examination space 16, and are provided as multi-dimensional look up tables residing in the digital data memory unit 30. In a next step 88, a first drive port 58 of the selected pair of drive ports 58, 60 is electrically connected to the first RF power source 44 and a second drive port 60 of the selected pair of drive ports 58, 60 is electrically connected to the second RF power source 46 via the plurality of switching members 68, 70, 72, 74. In the following step 90, RF power is provided from the first RF power source 44 and the second RF power source 46 to the selected pair of drive ports 58, 60. Then, using the selected pair of drive ports 58, 60, a first magnetic resonance scan is conducted in another step 92. In the following step 94, a first magnetic resonance image is generated from the conducted first magnetic resonance scan. Next, a different pair of drive ports 62, 64 of the plurality of pairs of drive ports 58, 60, 62, 64 is selected in another step 96. In a next step 98, a first drive port 62 of the selected different pair of drive ports 62, 64 is electrically connected to the first RF power source 44 and a second drive port 64 of the selected pair of drive ports 62, 64 is electrically connected to the second RF power source 46 via the plurality of switching members 68, 70, 72, 74. In the next step 100 then, RF power is provided to the different pair of drive ports 62, 64 of the plurality of pairs of drive ports 58, 60, 62, 64. A second magnetic resonance scan is conducted, using the selected different pair of drive ports, in the following step 102. As a next step 104, a magnetic resonance image from the conducted second magnetic resonance scan is generated. In a final step 106, the pair of drive ports yielding the magnetic resonance image with superior properties with regard to at least one criterion is selected for executing the desired MRI examination.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

| REFERENCE SYMBOL LIST | |
|---|---|
| 10 | MR examination system |
| 12 | scanner unit |
| 14 | main magnet |
| 16 | examination space |
| 18 | center axis |
| 20 | subject of interest |
| 22 | gradient coil system |
| 24 | gradient coil driver unit |
| 26 | control unit |
| 28 | human interface device |
| 30 | digital data memory unit |
| 32 | processor unit |
| 34 | signal processing unit |
| 36 | RF shield |
| 38 | electronic switch circuit |
| 40 | RF transmit system |
| 42 | RF driver unit |
| 44 | $1^{st}$ RF power source |
| 46 | $2^{nd}$ RF power source |
| 48 | RF coil arrangement |
| 50 | center axis |
| 52 | loop member |
| 54 | rung |
| 56 | azimuthal direction |
| 58 | drive port |
| 60 | drive port |
| 62 | drive port |
| 64 | drive port |
| 66 | RF transmission line |
| 68 | switching member |
| 70 | switching member |
| 72 | switching member |
| 74 | switching member |
| 76 | RF driver unit |
| 78 | 90° hybrid RF coupler |
| 80 | terminating impedance |
| 82 | $1^{st}$ RF power source |
| 84 | $2^{nd}$ RF power source |
| θ | azimuthal angle |
| | Steps |
| 86 | select pair of drive ports |

-continued

| REFERENCE SYMBOL LIST | |
|---|---|
| 88 | electrically connect selected pair of drive ports to RF power sources |
| 90 | provide RF power to selected pair of drive ports |
| 92 | conduct MR scan |
| 94 | generate MR image from conducted scan |
| 96 | select different pair of drive ports |
| 98 | electrically connect selected different pair of drive ports to RF power sources |
| 100 | provide RF power to selected different pair of drive ports |
| 102 | conduct another MR scan |
| 104 | generate MR image from last conducted MR scan |
| 106 | select pair of drive ports that yielded MR image with superior property |
| A | center axis |
| $B_1$ | RF magnetic excitation field |
| CA | RF coil arrangement |
| DP | drive port |
| L | loop member |
| P | power source |
| R | rung |

The invention claimed is:

1. A radio frequency transmit system for use in magnetic resonance imaging apparatuses, the radio frequency transmit system comprising
   a radio frequency driver unit including at least a first radio frequency power source and a second radio frequency power source,
   a radio frequency coil arrangement having a center axis and further including:
     a plurality of radio frequency coil members,
     a plurality of at least two pairs of drive ports electrically connected to radio frequency coil members of the plurality of radio frequency coil members,
   wherein the drive ports of each pair of drive ports of the plurality of pairs of drive ports are arranged spaced by an angular distance of 90' in an azimuthal direction about the center axis, and
   wherein the radio frequency coil arrangement is configured for generating a radio frequency magnetic excitation field $B_1$ when radio frequency power is being supplied to a pair of drive ports of the plurality of drive ports, and
   a plurality of switching members that are configured for electrically connecting the first radio frequency power source to a first drive port of a first pair of drive ports of the plurality of pairs of drive ports and for electrically connecting the second radio frequency power source to a second drive port of the first pair of drive ports in a first switching status, and are further configured for electrically connecting the first radio frequency power source to a first drive port of the at least second pair of drive ports of the plurality of pairs of drive ports and for electrically connecting the second radio frequency power source to a second drive port of the at least second pair of drive ports in at least a second switching status,
   wherein the first drive port of the first pair of drive ports and the first drive port of the at least second pair of drive ports are arranged spaced by a fixed predetermined angular distance in the azimuthal direction about the center axis.

2. The radio frequency transmit system of claim 1, wherein the first radio frequency power source and the second radio frequency power source have an equal nominal power rating.

3. The radio frequency transmit system in claim 1, wherein the radio frequency coil arrangement is configured as a birdcage coil or a TEM coil.

4. The radio frequency transmit system of claim 1, wherein in at least one plane arranged perpendicular to the center axis, centers of the plurality of radio frequency coil members are arranged on a circumference of a virtual ellipse.

5. The radio frequency transmit system of claim 1, wherein the fixed predetermined angular distance has an absolute value between $10°$ and $45°$.

6. The radio frequency transmit system of claim 1, wherein the first radio frequency power source and the second radio frequency power source are configured as two output ports of a $90°$ hybrid coupler that is electrically connected to a single RF power source at an input port.

7. The radio frequency transmit system of claim 1, wherein electrical connections for connecting the drive ports to the switching members comprise at least one radio frequency transmission line with an effective electrical length that is equal to a whole multiple of one half of a wavelength of the Larmor frequency.

8. The radio frequency transmit system of claim 1, wherein the switching members of the plurality of switching members comprise at least one out of a mechanical switch, a diode, a transistor and an MEMS radio frequency switch.

9. A magnetic resonance imaging system configured for acquiring magnetic resonance signals from at least a portion of a subject of interest and for providing
   magnetic resonance images from the acquired magnetic resonance signals, comprising:
   an examination space 16) provided to arrange at least a portion of the subject of interest within,
   a main magnet that is configured for generating a quasi-static magnetic field $B_0$ at least in the examination space,
   wherein the examination space is arranged within the quasi-static magnetic field $B_0$ of the main magnet,
   a control unit that is configured for controlling functions of the magnetic resonance imaging system,
   a signal processing unit provided for processing magnetic resonance signals to generate at least one magnetic resonance image of at least the portion of the subject of interest from the received magnetic resonance signals, and
   a radio frequency transmit system as claimed in claim 1.

10. A method of operating a radio frequency transmit system of claim 1, the method comprising:
    based on predetermined calibration results, selecting a pair of drive ports of the plurality of pairs of drive ports,
    electrically connecting a first drive port of the selected pair of drive ports to the first radio frequency power source and a second drive port of the selected pair of drive ports to the second radio frequency power source via the plurality of switching members, and
    providing radio frequency power from the first radio frequency power source and the second radio frequency power source to the selected pair of drive ports.

11. The method as claimed in claim 10, further comprising:
   conducting a first magnetic resonance scan, using the selected pair of drive ports,
   generating a first magnetic resonance image from the conducted first magnetic resonance scan,
   selecting a different pair of drive ports of the plurality of drive ports for providing RF power to,
   conducting a second magnetic resonance scan, using the selected different pair of drive ports, and
   generating a magnetic resonance image from the conducted second magnetic resonance scan.

12. The method of claim 10, comprising preceding steps of
   selecting a pair of drive ports of the plurality of pairs of drive ports,
   electrically connecting a first drive port of the selected pair of drive ports to the first radio frequency power source and a second drive port of the selected pair of drive ports to the second radio frequency power source via the plurality of switching members,
   providing radio frequency power from the first radio frequency power source and the second radio frequency power source to the selected pair of drive ports,
   conducting a mapping measurement of the radio frequency magnetic excitation field $B_1$ generated by the radio frequency coil arrangement,
   based on a result of the mapping measurement, determine a specific pair of drive ports of the plurality of pairs of drive ports that is able to generate the radio frequency magnetic excitation field $B_1$ with a highest value regarding a radio frequency magnetic excitation field $B_1$-related optimization parameter under the constraint of an as equal as possible radio frequency power demand of a first drive port of the specific pair of drive ports and a second drive port of the specific pair of drive ports.

13. The method of claim 10, comprising:
   selecting a pair of drive ports of the plurality of pairs of drive ports,
   electrically connecting a first drive port of the selected pair of drive ports to the first radio frequency power source and a second drive port of the selected pair of drive ports to the second radio frequency power source via the plurality of switching members,
   providing radio frequency power from the first radio frequency power source and the second radio frequency power source to the selected pair of drive ports,
   conducting a mapping measurement of the radio frequency magnetic excitation field B1 generated by the radio frequency coil arrangement,
   repeating the preceding steps for all pairs of drive ports of the plurality of pairs of drive ports,
   recording the specific pair of drive ports of the plurality of pairs of drive ports that provides the radio frequency magnetic excitation field $B_1$ with a highest value regarding a radio frequency magnetic excitation field $B_1$-related optimization parameter under the constraint of an as equal as possible radio frequency power demand of a first drive port of the specific pair of drive ports and a second drive port of the specific pair of drive ports.

14. The method of claim 12, wherein the optimization parameter is selected from a group formed by
   a degree of homogeneity of the radio frequency magnetic excitation field $B_1$,
   radio frequency power efficiency, defined as the ratio of a total radio frequency power applied to the achievable average radio frequency magnetic excitation field $B_1$ in a selected slice, and
   the reciprocal of a local or global specific absorption rate generated by the radio frequency magnetic excitation field $B_1$.

* * * * *